US008885339B2

(12) United States Patent
Crisp et al.

(10) Patent No.: US 8,885,339 B2
(45) Date of Patent: Nov. 11, 2014

(54) SYSTEM AND METHOD FOR A CONVERTIBLE TOWER-TO-RACK ENCLOSURE

(71) Applicant: Dell Products L.P., Round Rock, TX (US)

(72) Inventors: Richard A. Crisp, Austin, TX (US); Austin J. Orand, Portland, OR (US); Paul D. Kramer, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 14/218,644

(22) Filed: Mar. 18, 2014

(65) Prior Publication Data

US 2014/0204521 A1    Jul. 24, 2014

Related U.S. Application Data

(63) Continuation of application No. 13/410,648, filed on Mar. 2, 2012, now Pat. No. 8,755,189.

(51) Int. Cl.
*G06F 1/16* (2006.01)
*H05K 7/14* (2006.01)
*H05K 5/03* (2006.01)
*H05K 7/18* (2006.01)

(52) U.S. Cl.
CPC ............. *H05K 7/1488* (2013.01); *H05K 5/03* (2013.01); *H05K 7/183* (2013.01)
USPC ...... 361/679.59; 361/724; 361/725; 361/727; 312/223.1; 312/223.2

(58) Field of Classification Search
USPC ................................................ 361/679.59
See application file for complete search history.

(56) References Cited

U.S. PATENT DOCUMENTS

| 5,450,285 | A | * | 9/1995 | Schlemmer ................... 361/724 |
| 5,604,662 | A | * | 2/1997 | Anderson et al. ......... 361/679.32 |
| 5,737,189 | A | * | 4/1998 | Kammersgard et al. ...... 361/726 |
| 5,896,273 | A | * | 4/1999 | Varghese et al. .............. 361/724 |
| 6,137,677 | A |   | 10/2000 | Ganthier et al. |
| 6,259,605 | B1 | * | 7/2001 | Schmitt .......................... 361/727 |
| 6,362,955 | B2 |   | 3/2002 | Felcman et al. |
| 6,377,446 | B1 | * | 4/2002 | Liau .......................... 361/679.59 |

(Continued)

OTHER PUBLICATIONS

Hewlett-Packard; "HP ProLiant DL370 G6 and HP ProLiant ML370 G6 Servers"; www2.hp.com; 4 pgs.

(Continued)

*Primary Examiner* — Anthony Q Edwards
(74) *Attorney, Agent, or Firm* — Jackson Walker L.L.P.

(57) ABSTRACT

In accordance with the teachings of the present disclosure, an information handling system comprises an information handling resource and a chassis. The chassis includes a slot configured to receive the information handling resource. The chassis also includes a first rack ear and a second rack ear, each configured to facilitate removal of the information handling system from a server rack system. The first rack ear and second rack ear are further configured to interface with a first cover configured for placement on a first side of the chassis and a second cover configured for placement on a second side of the chassis, respectively. The first cover acts as the top of the information handling system and the second cover acts as the bottom of the information handling system when the information handling system is in the tower configuration.

27 Claims, 4 Drawing Sheets

(56) References Cited

U.S. PATENT DOCUMENTS 6,618,247 B2 *  9/2003  Felcman et al. ............ 361/679.6
7,054,144 B2    5/2006  Heistand, II et al.
7,643,303 B1    1/2010  Heistand, II et al.
7,733,640 B2    6/2010  Huang
8,328,026 B2   12/2012  Boduch et al.
8,472,187 B2    6/2013  Sakamoto et al.

OTHER PUBLICATIONS

Hewlett-Packard; "Rack to Tower and Tower to Rack System Conversion Guide—HP Integrity rx2620"; www1.hp.com; 29 pgs.

* cited by examiner

SYSTEM AND METHOD FOR A CONVERTIBLE TOWER-TO-RACK ENCLOSURE

The present patent application is a continuation of a previously filed patent application, U.S. patent application Ser. No. 13/410,648, filed Mar. 2, 2012, the entirety of which is hereby incorporated by reference. Pursuant to 37 CFR §1.78(a)(3), an application data sheet containing a reference to the previously filed application, unless submitted previously, is submitted contemporaneously herewith.

TECHNICAL FIELD

The present disclosure relates in general to information handling systems, and more particularly to a system and method for a convertible tower-to-rack enclosure.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems may be configured as server systems. A server may be configured in a "tower" configuration where the server stands on a floor in a vertical position. Additionally, a server may be configured in a "rack" configuration where the server is placed in a horizontal position on a rack in a server cabinet. In traditional methodologies, converting a server from a tower configuration to a rack configuration, or vice versa, requires substantial reconfiguration of the server that can be time consuming and expensive.

SUMMARY

In accordance with the teachings of the present disclosure, the disadvantages and problems associated with tower-to-rack conversions of servers, have been reduced or eliminated. In accordance with the teachings of the present disclosure, an information handling system comprises an information handling resource and a chassis. The chassis includes a slot configured to receive the information handling resource. The chassis also includes a first rack ear configured to facilitate removal of the information handling system from a server rack system when the information handling system is in a rack configuration. The first rack ear is further configured to interface with a first cover configured for placement on a first side of the chassis. The first cover acts as the top of the information handling system when the information handling system is in a tower configuration. The chassis additionally includes a second rack ear configured to facilitate removal of the information handling system from the server rack system when the information handling system is in the rack configuration. The second rack ear is further configured to interface with a second cover configured for placement on a second side of the chassis. The second cover acts as the bottom of the information handling system and is configured to support the information handling system when the information handling system is in the tower configuration.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1A-1C and 2, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components or the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, information handling resources may broadly refer to any component system, device or apparatus of an information handling system, including without limitation processors, busses, memories, input-output devices and/or interfaces, storage resources, network interfaces, motherboards, electro-mechanical devices (e.g., fans), displays, and power supplies.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such wires, optical fibers, microwaves, radio waves, and other electromagnetic and/or optical carriers; and/or any combination of the foregoing.

Figure 1A:
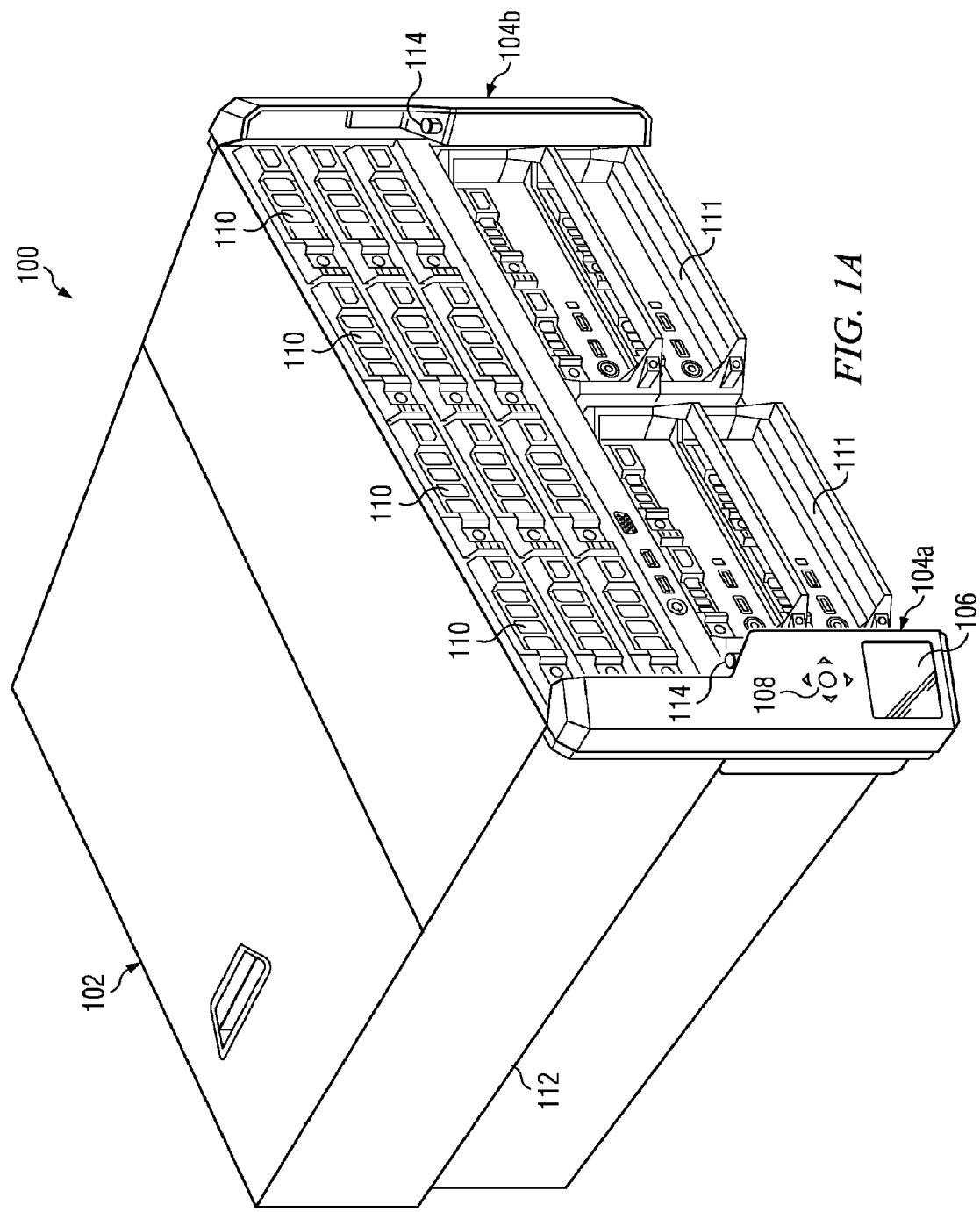
FIG. 1A illustrates an information handling system configured as server system, in accordance with some embodiments of the present disclosure.

FIG. 1A illustrates an information handling system 100 configured as a server system. Information handling system 100 may include a chassis 102 (also referred to as an enclosure) that may allow information handling system 100 to easily convert between a rack configuration and a tower configuration as described in further detail below. Such a conversion may include minimal changes to chassis 102 as compared to traditional tower-to-rack and rack-to-tower conversions. Accordingly, the cost and labor associated with converting information handling system 100 between a tower configuration and a rack configuration may be lower than in traditional configurations.

Information handling system 100 may include one or more processors, memory and storage media. A processor may include any system, device, or apparatus configured to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, a processor may interpret and/or execute program instructions and/or process data stored in memory and/or another component of information handling system 100.

Memory may be communicatively coupled to a processor and may include any system, device, or apparatus configured to retain program instructions and/or data for a period of time (e.g., computer-readable media). Memory may include random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to information handling system 100 is turned off.

Storage media may include computer-readable media (e.g., hard disk drive, floppy disk drive, CD-ROM, and/or other type of rotating storage media, flash memory, EEPROM, and/or other type of solid state storage media) and may be generally operable to store data and/or programs (e.g., one or more operating systems and/or one or more application programs).

Chassis 102 may include a plurality of slots (not expressly labeled) configured to receive any number of information handling resources associated with information handling system 100. In the present embodiment the slots of chassis 102 may include information handling resources 110 and 111 that may comprise drives and/or peripheral devices that may include one or more processors, memory and/or storage media.

Figure 1B:
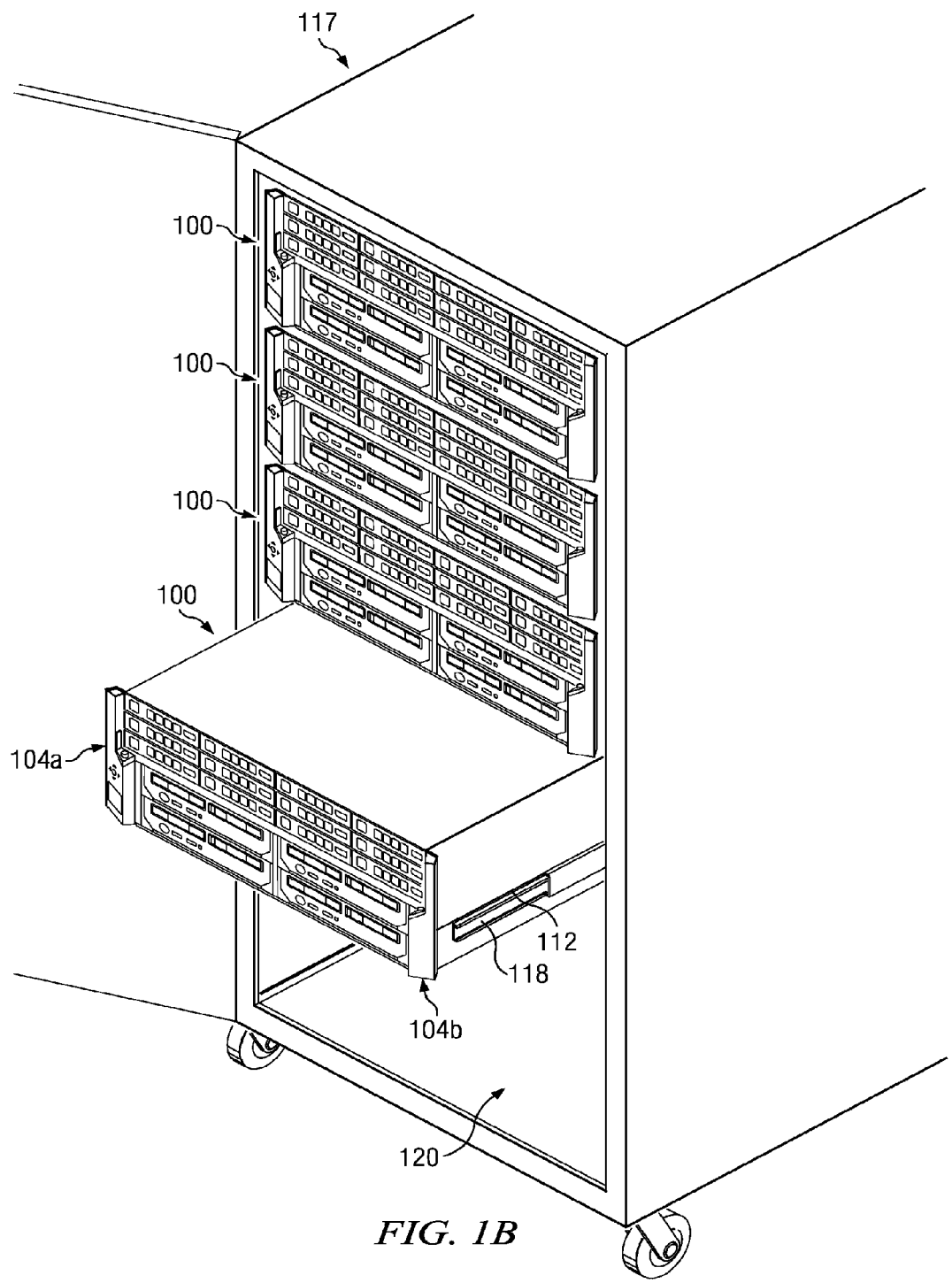
FIG. 1B illustrates the information handling system of FIG. 1A in a rack configuration and integrated with a server rack, in accordance with some embodiments of the present disclosure.

Chassis 102 is depicted in FIG. 1A in a rack configuration such that information handling system 100 may be used within a server rack. Chassis 102 may include a rail ridge 112 on each side that may each be placed on rails of a server rack such that information handling system 100 is supported on the rails by rail ridges 112. FIG. 1B illustrates information handling system 100 integrated with a server rack 117 in which rail ridges 112 of information handling system 100 are placed on rails 118 of server rack 117.

Upon placement of rail ridges 112 on rails 118, information handling system 100 may be coupled to rails 118 and rails 118 may be configured to slide in and out of an enclosure 120 of server rack 117. Accordingly, information handling system 100 may be slid in and out of enclosure 120 of server rack 117. FIG. 1B illustrates an information handling system 100 pulled out from enclosure 120 and other information handling systems 100 inserted within enclosure 120.

Chassis 102 may also include rack "ears" 104a and 104b coupled to chassis 102 at the front of chassis 102. Rack ears 104 may comprise any suitable apparatus or device configured to facilitate insertion and/or removal of information handling system 100 within enclosure 120 of server rack 117. For example, rack ears 104 may each have an outside lip that acts as a handle to allow a person to pull information handling system 100 out from the enclosure of server rack 117 as depicted in FIG. 1B.

Chassis 102 may include a securing mechanism (not expressly shown) configured to secure information handling system 100 within enclosure 120 such that information handling system 100 may not be pulled out from enclosure 120 without releasing the securing mechanism. In such embodiments rack ears 104 may also include a releasing mechanism that releases the securing mechanism to allow removal of information handling system 100 from enclosure 120. FIG. 1A illustrates a releasing mechanism 114 configured to perform such an operation.

Releasing mechanism 114 may comprise any suitable system, apparatus or device configured to disengage the securing mechanism to allow removal of information handling system from a server rack enclosure (e.g., enclosure 120 of server rack 117 in FIG. 1B). In the present embodiment, releasing mechanism 114 may comprise a plunger system with a spring that maintains the plunger in an extended position. When the plunger is in the extended position, the securing mechanism may be engaged to prevent removal of information handling system 100 from the enclosure of a server rack (e.g., enclosure 120 of server rack 117 of FIG. 1B). When the plunger is depressed (e.g., by a person wanting to remove information handling system from enclosure 120), releasing mechanism 114 may release the securing mechanism to allow removal of information handling system 100 from the enclosure.

For security purposes, access to information handling system 100 and its associated information handling resources 110 and 111 may be restricted. Accordingly, information handling system 100 may include a security cover 116 shown in FIG. 1C. Security cover 116 may be configured to be placed between rack ears 104 and may restrict access to information handling resources 110 and 111 of information handling system 100. Additionally, security cover 116 may prevent access to releasing mechanism 114 to help prevent removal of information handling system 100 from enclosure 120 of server rack 117. Security cover 116 may include a locking mechanism 122 configured to lock security cover 116 in place and prevent removal of security cover 116 without a proper key or any other unlocking mechanism configured to unlock locking mechanism 122. In the present example, locking mechanism 122 is depicted as a mechanical lock with a key, however it is understood that any suitable type of locking mechanism with various types of unlocking mechanisms may be used. For example, locking mechanism 122 may be associated with a key pad such that it may be unlocked by entering a specific code or password. In other embodiments, locking mechanism 122 may be associated with a biometric scanner that may unlock locking mechanism 122 upon recognition of a specific biological trait (e.g., a fingerprint) of an authorized person.

Returning to FIG. 1A, rack ears 104 may be integrated with chassis 102 such that rack ears 104 are present when information handling system 100 is in a rack configuration and a tower configuration. In contrast, traditional rack-to-tower conversions include removal of the rack ears, which causes time and cost inefficiencies.

For example, rack ear 104a may include a display 106. Display 106 may comprise any suitable apparatus, system, or device configured to display information to a user of information handling system 100. The information shown by display 106 may include, but are not limited to system status, module and drive health, and initial setup and configuration. In the present embodiment, display 106 may comprise a liquid crystal display (LCD), however display 106 may comprise any other suitable display type.

Figure 1C:
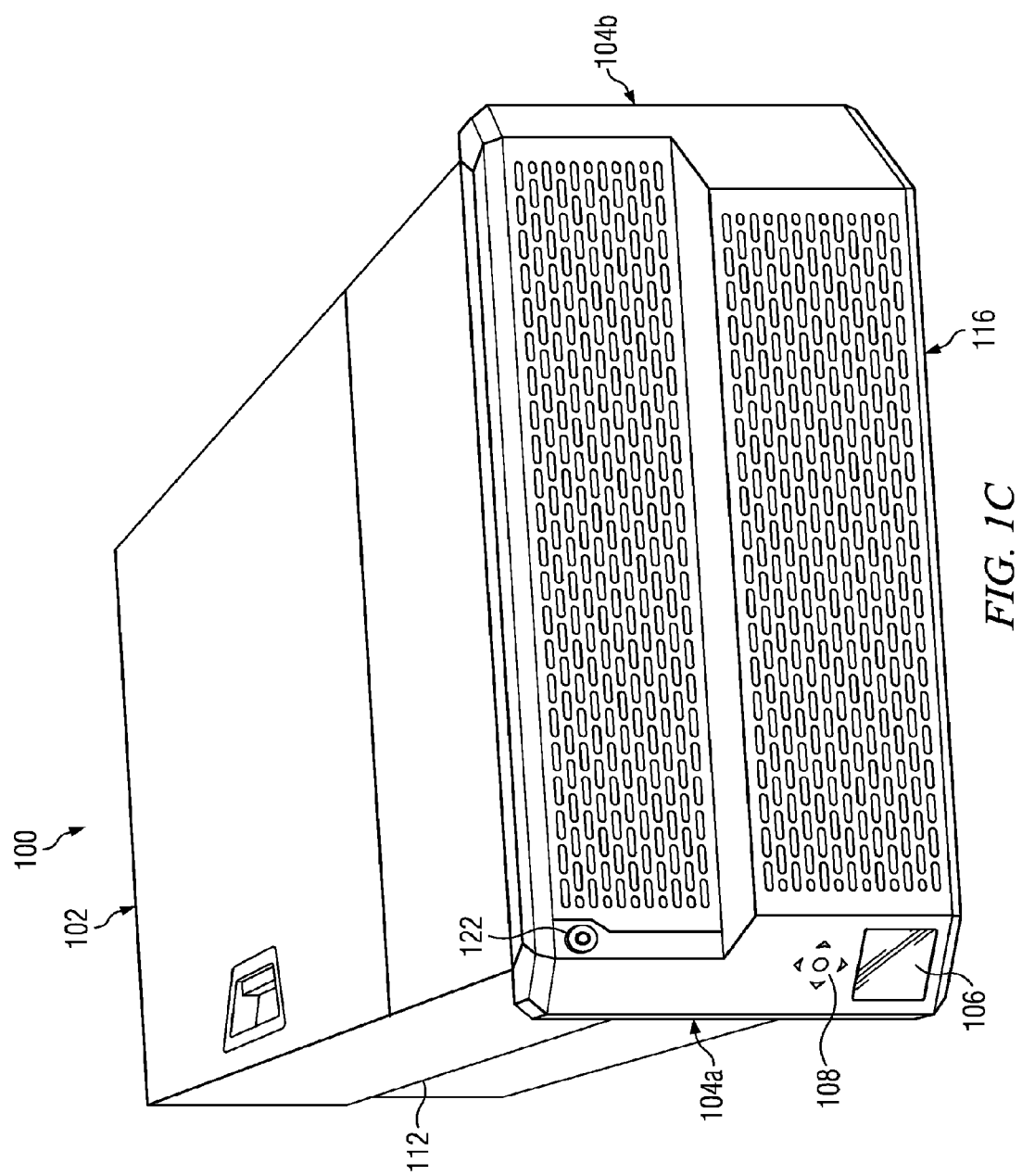
FIG. 1C illustrates a security cover associated with the information handling system of FIG. 1A, in accordance with some embodiments of the present disclosure.
Figure 2:
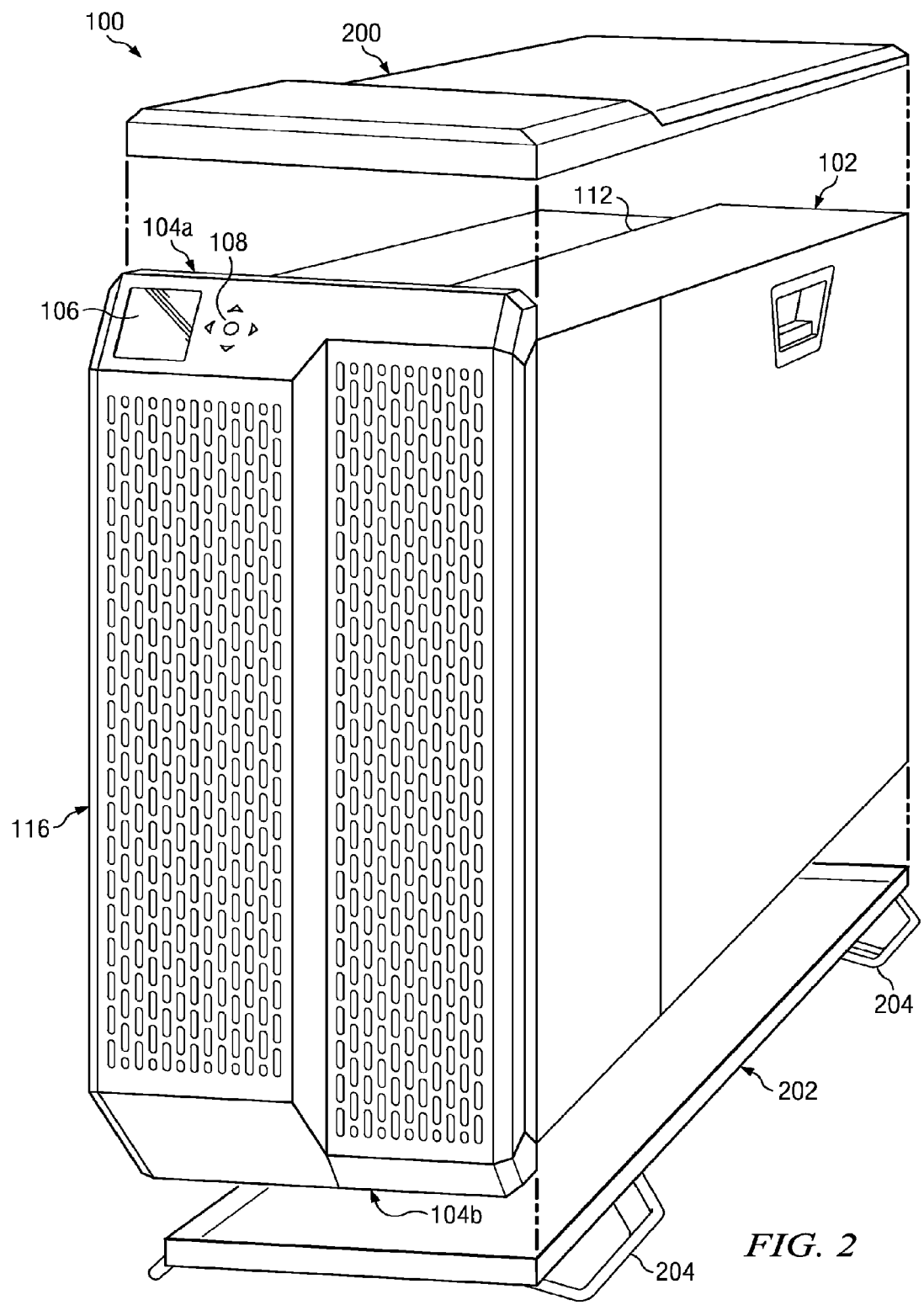
FIG. 2 illustrates the information handling system of FIG. 1A in a tower configuration, in accordance with some embodiments of the present disclosure.

Display 106 may also be configured such that the image shown on display 106 rotates depending on the orientation of information handling system 100. For example, when information handling system 100 is in a horizontal position (e.g., in a rack configuration as shown in FIGS. 1A-1C) the image shown on display 106 may be oriented to match the orientation of information handling system 100. However, if information handling system 100 is then placed in a vertical position (e.g., in a tower configuration as shown in FIG. 2, and explained in further detail below), the image shown on display 106 may automatically rotate 90° such that the image is also oriented to match the orientation of information handling system 100 when information handling system 100 is configured as a tower. Accordingly, display 106 may be configured such that the image is properly oriented at all times without a user having to make any adjustments to the actual display, thus facilitating the conversion between rack and tower configurations.

Rack ear 104a may also include a control panel 108 configured to allow navigation of images shown on display 106 and execute commands shown on display 106. Control panel 108 may comprise any suitable system apparatus or device for transmitting commands to a processor of information handling system 100 via control panel 108 and display 106. For example, control panel 108 may include any combination of one or more physical buttons, touch screen buttons, command wheels, navigation knobs, joysticks, etc.

Control panel 108 may be configured such that navigation and control within display 106 may be uniform regardless of the orientation of information handling system 100. For example, in the present embodiment, control panel 108 may be symmetrical on all four sides such that regardless of the orientation of information handling system 100, control panel 108 appears the same from the perspective of the user of control panel 108. Accordingly, users may not need to change how they use control panel 108 when information handling system 100 is in a tower configuration or a rack configuration.

As described above, information handling system 100 may easily be converted between a rack configuration and a tower configuration. FIG. 2 illustrates information handling system 100 in a tower configuration. Information handling system 100 may be converted from a rack configuration to a tower configuration through the simple addition of top cover 200 and bottom cover 202.

Top cover 200 may comprise any suitable component made out of any suitable material (e.g., plastic, metal, carbon fiber, etc.) configured to be detachably coupled to chassis 102 at the "top" of chassis 102 and interface with rack ear 104a when information handling system 100 is oriented as shown in FIG. 2. Accordingly, top cover 200 may cover up the rail ridge 112 associated with the "top" of chassis 102 to protect the rail ridge 112 and provide a more aesthetic look for information handling system 100 by interfacing with rack ear 104a while information handling system 100 is in a tower configuration. Additionally, in some embodiments top cover 200 may include panels that provide access to chassis 102 (not expressly shown) and/or grab handles (not expressly shown) that may facilitate moving information handling system 100.

Bottom cover 202 may comprise any suitable component made out of any suitable material (e.g., plastic, metal, etc.) and configured to be detachably coupled to chassis 102 and interface with rack ear 104b at the "bottom" of chassis 102 when information handling system 100 is oriented in a tower configuration as shown in FIG. 2. Bottom cover 202 may be configured to cover the rail ridge 112 associated with the "bottom" of chassis 102 and may provide stability and support to information handling system 100 such that information handling system 100 may "stand" on a surface in a vertical position such as shown in FIG. 2. In the present embodiment, bottom cover 202 may include feet 204 that provide such stability and support. Additionally feet 204 may be configured to raise information handling system 100 off of the surface to protect information handling system 100 from materials (e.g., liquids) that may be potentially hazardous to information handling system 100. In other embodiments bottom cover 102 may not include feet 104, or feet 104 may be different from the specific configuration depicted in FIG. 2.

As previously mentioned, when in a tower configuration, rack ear 104a may be at the "top" of information handling system 100 such that display 106 and control panel 108 are visible to and accessible by a user of information handling system 100. Additionally, as previously mentioned, the image on display 106 may automatically rotate with information handling system in a tower configuration such that the image is properly oriented. Further, as can be seen in a comparison between FIGS. 1A and 2, control panel 108 and its associated functionality may be presented to the user in a uniform manner in both the rack configuration and the tower configuration. Accordingly, information handling system 100 and its associated chassis 102 may be configured to allow for an easy conversion between a rack configuration and a tower configuration of information handling system 100.

Although the present disclosure has been described in detail, it should be understood that various changes, substitutions, and alterations can be made hereto without departing from the spirit and the scope of the disclosure as defined by the appended claims. For example the specific shape, size and aesthetics of any one or combination of chassis 102, rack ears 104, display 106, control panel 108, information handling resources 110 and 111, and security cover 116 may be different than those depicted depending on the application with which information handling system 100 may be used. Further, releasing mechanism 114 and locking mechanism 116 are depicted as having a specific design and configuration, however it is understood that any suitable releasing mechanism and/or locking mechanism may be used for these particular components.

What is claimed is:
1. An information handling system comprising:
an information handling resource; and
a chassis comprising:
  a slot configured to receive the information handling resource; and
  a rack ear configured to:
    facilitate removal of the information handling system from a server rack system when the information handling system is in a rack configuration; and
    interface with a cover configured for placement on a side of the chassis when the information handling system is in a tower configuration.

2. The information handling system of claim 1, the chassis further comprising a second rack ear configured to facilitate removal of the information handling system from the server rack system when the information handling system is in the rack configuration.

3. The information handling system of claim 1, the rack ear comprising a display configured to display an image and rotate the image according to an orientation of the information handling system.

4. The information handling system of claim 1, the rack ear comprising a control panel configured to allow uniform control operations when the information handling system is in the tower configuration and the rack configuration.

5. The information handling system of claim 1, the cover comprising one or more feet configured to support the information handling system when the information handling system is in the tower configuration.

6. The information handling system of claim 1, the side comprising a rail ridge configured to at least partially support the information handling system on a rail associated with the server rack system.

7. The information handling system of claim 6, the cover configured to cover the rail ridge.

8. The information handling system of claim 1, further comprising a security cover configured to be detachably locked to the chassis and interface with the rack ear to restrict access to the information handling resource.

9. The information handling system of claim 1, the chassis further comprising a securing mechanism configured to secure the information handling system to the server rack system and the rack ear including a releasing mechanism configured to release the securing mechanism to allow removal of the information handling system from the server rack system.

10. The information handling system of claim 9, further comprising a security cover configured to be detachably locked to the chassis and interface with the rack ear to restrict access to the releasing mechanism and the information handling resource.

11. The information handling system of claim 1, wherein the cover acts as the top of the information handling system when the information handling system is in a tower configuration.

12. The information handling system of claim 1, wherein the cover acts as the bottom of the information handling system and configured to support the information handling system when the information handling system is in the tower configuration.

13. A chassis associated with an information handling system comprising:
   a slot configured to receive the information handling resource; and
   a rack ear configured to:
      facilitate removal of the information handling system from a server rack system when the information handling system is in a rack configuration; and
      interface with a cover configured for placement on a side of the chassis when the information handling system is in a tower configuration.

14. The chassis of claim 13, further comprising a second rack ear configured to facilitate removal of the information handling system from the server rack system when the information handling system is in the rack configuration.

15. The chassis of claim 13, the rack ear comprising a display configured to display an image and rotate the image according to an orientation of the information handling system.

16. The chassis of claim 13, the rack ear comprising a control panel configured to allow uniform control operations when the information handling system is in the tower configuration and the rack configuration.

17. The chassis of claim 13, the cover comprising one or more feet configured to support the information handling system when the information handling system is in the tower configuration.

18. The chassis of claim 13, the side comprising a rail ridge configured to at least partially support the information handling system on a rail associated with the server rack system.

19. The chassis of claim 18, the cover configured to cover the rail ridge.

20. The chassis of claim 13, further comprising a security cover configured to be detachably locked to the chassis and interface with the rack ear to restrict access to the information handling resource.

21. The chassis of claim 13, further comprising a securing mechanism configured to secure the information handling system to the server rack system and the rack ear including a releasing mechanism configured to release the securing mechanism to allow removal of the information handling system from the server rack system.

22. The chassis of claim 21, further comprising a security cover configured to be detachably locked to the chassis and interface with the rack ear to restrict access to the releasing mechanism and the information handling resource.

23. The method of claim 13, wherein the cover acts as the top of the information handling system when the information handling system is in a tower configuration.

24. The method of claim 13, wherein the cover acts as the bottom of the information handling system and configured to support the information handling system when the information handling system is in the tower configuration.

25. A method for configuring a chassis of an information handling system comprising:
   configuring a rack ear of the chassis such that the rack ear:
      facilitates removal of the information handling system from a server rack system when the information handling system is in a rack configuration; and
      interfaces with a cover configured for placement on a side of the chassis when the information handling system is in a tower configuration.

26. The method of claim 25, wherein the cover acts as the top of the information handling system when the information handling system is in a tower configuration.

27. The method of claim 25, wherein the cover acts as the bottom of the information handling system and configured to support the information handling system when the information handling system is in the tower configuration.

* * * * *